United States Patent [19]
Ahmad

[11] Patent Number: 6,110,761
[45] Date of Patent: *Aug. 29, 2000

[54] METHODS FOR SIMULTANEOUSLY ELECTRICALLY AND MECHANICALLY ATTACHING LEAD FRAMES TO SEMICONDUCTOR DICE AND THE RESULTING ELEMENTS

[75] Inventor: Syed Sajid Ahmad, Boise, Id.

[73] Assignee: Micron Technology, Inc., Boise, Id.

[*] Notice: This patent is subject to a terminal disclaimer.

[21] Appl. No.: 09/146,709

[22] Filed: Sep. 3, 1998

Related U.S. Application Data

[63] Continuation-in-part of application No. 08/916,931, Aug. 21, 1997, which is a continuation-in-part of application No. 08/906,673, Aug. 5, 1997, Pat. No. 6,013,535.

[51] Int. Cl.⁷ ................................. H01L 21/44
[52] U.S. Cl. .................. 438/118; 438/119; 438/123; 438/453
[58] Field of Search ............................ 438/106, 111, 438/123, 15, 118, 119, 458, 612

[56] References Cited

U.S. PATENT DOCUMENTS

| | | | |
|---|---|---|---|
| Re. 35,027 | 8/1995 | Ragard | 29/740 |
| 4,045,863 | 9/1977 | Mitterhummer et al. | 29/588 |
| 4,346,124 | 8/1982 | Wood et al. | 427/82 |
| 4,355,463 | 10/1982 | Burns | 29/827 |
| 4,687,693 | 8/1987 | Sheyon et al. | 428/148 |
| 4,862,245 | 8/1989 | Pashby et al. | 357/70 |
| 4,876,221 | 10/1989 | Hatada | 437/212 |
| 4,959,008 | 9/1990 | Wasulko | 428/40 |
| 5,030,308 | 7/1991 | Sheyon et al. | 156/235 |
| 5,049,434 | 9/1991 | Wasulko | 428/202 |
| 5,066,614 | 11/1991 | Dunaway et al. | 228/180.21 |
| 5,139,973 | 8/1992 | Nagy et al. | 437/211 |
| 5,140,404 | 8/1992 | Fogal et al. | 257/783 |
| 5,256,598 | 10/1993 | Farnworth et al. | 29/827 |
| 5,286,679 | 2/1994 | Farnsworth et al. | 437/209 |
| 5,302,849 | 4/1994 | Cavasin | 257/666 |
| 5,304,842 | 4/1994 | Farnworth et al. | 257/668 |
| 5,322,207 | 6/1994 | Fogal et al. | 228/180.5 |
| 5,409,863 | 4/1995 | Newman | 437/209 |
| 5,482,739 | 1/1996 | Glenn et al. | 427/96 |
| 5,548,160 | 8/1996 | Corbett et al. | 257/666 |
| 5,563,443 | 10/1996 | Beng et al. | 257/666 |
| 5,585,282 | 12/1996 | Wood et al. | 437/8 |
| 5,696,033 | 12/1997 | Kinsman | 437/217 |
| 5,733,800 | 3/1998 | Moden | 437/220 |
| 5,739,053 | 4/1998 | Kawakita et al. | 438/108 |
| 5,773,322 | 6/1998 | Weld | 438/117 |
| 5,810,926 | 9/1998 | Evers | 118/309 |
| 5,834,062 | 11/1998 | Johnson et al. | 427/256 |
| 5,897,339 | 4/1999 | Song et al. | 438/118 |
| 5,923,957 | 7/1999 | Song et al. | 438/118 |

*Primary Examiner*—John F. Niebling
*Assistant Examiner*—Christopher Lattin
*Attorney, Agent, or Firm*—Trask Britt

[57] ABSTRACT

Methods for applying an adhesive material to a semiconductor connection component and the resulting structures. The method is practiced by providing a flowable adhesive material, providing a semiconductor connection component having a first portion horizontally offset from a second portion, and contacting the first portion of the semiconductor connection component with the adhesive material so a portion of the adhesive material attaches to the first portion. The semiconductor connection component may be a lead frame element having a lead finger. The adhesive material is an electrically conductive material. The first portion of the semiconductor connection component may also be vertically offset from the second portion. The semiconductor connection component with the adhesive material attached to the first portion thereof may then be contacted with a surface of a semiconductor die to attach the component to the die. By applying the adhesive material only to the first portion, the adhesive material is precisely applied in a simple manner, little adhesive material is washed, and a one-step electrical/mechanical connection to bond pads of the die is provided.

42 Claims, 2 Drawing Sheets

METHODS FOR SIMULTANEOUSLY ELECTRICALLY AND MECHANICALLY ATTACHING LEAD FRAMES TO SEMICONDUCTOR DICE AND THE RESULTING ELEMENTS

This application is a continuation-in-part application of U.S. application Ser. Nos. 08/916,931 and 08/906,673 now U.S. Pat. No. 6,013,535.

BACKGROUND OF THE INVENTION

The present invention relates to methods for attaching lead fingers to semiconductor dice and the structures formed thereby. More particularly, the present invention relates to methods for attaching lead fingers to semiconductor dice by using adhesive materials, and the structures formed from these methods.

The semiconductor industry has several goals for integrated circuit (IC) design and fabrication, such as increased performance, lower cost, increased miniaturization, and greater packaging density. One method of lowering the cost of designing and fabricating ICs is to reduce the amount of materials used, or use the materials more efficiently. One part of IC design and fabrication which inefficiently uses materials is processes for attaching or bonding semiconductor dice to a package or other connections such as lead frames. These processes include wirebonding, tape-automated-bonding connections, "lead-over-chip" ("LOC") connections, and a polymer dip chip used with a bumped die method. Another such process includes the process described in U.S. Pat. No. 5,585,282, the disclosure of which is incorporated herein by reference.

There are several methods for attaching a lead frame to a semiconductor die. One such method is the "lead-over-chip" ("LOC") method, such as those disclosed in U.S. Pat. Nos. 5,302,849, 5,548,160, and 5,286,679 ("the '679 patent"), the disclosures of which are incorporated herein by reference. The '679 patent discloses a LOC method which employs an adhesive material. The method described in the '679 patent applies a thermoplastic or thermoset adhesive to a semiconductor wafer. The adhesive layer is patterned during application to cover desired portions of the wafer by hot or cold screen/stencil printing or a dispensing process. After baking the adhesive layer on the semiconductor wafer to stabilize it, the individual dice are cut from the semiconductor wafer. During packaging, each adhesive-coated die is attached to the fingers of a lead frame by heating and pressing the fingers to the die. If the adhesive contains a thermoset material, a separate cure is then performed if the attach process does not, or cannot perform the cure. The method of the '679 patent unfortunately attaches the lead frame to the die inefficiently, i.e., it fails to achieve an adhesive material profile with enough upper surface area to efficiently attach the lead fingers.

In another LOC method, an adhesive tape (preferably insulative tape) is attached to an active surface of a semiconductor die and then lead fingers are attached to the adhesive tape. Although this method effectively attaches the fingers of the lead frame to the die, it is more expensive than using an adhesive material because the adhesive-coated tape costs more than the adhesive material. This adhesive tape method is also more expensive because of the fabrication steps required to cut individual tape segments from a larger sheet and material wasted when the tape segments are cut out. Further, the tape segments are often placed on a carrier film for transport to the die-attach site, raising both the cost and the complexity of the attachment process even more.

In yet another LOC method, an adhesive material is placed on the fingers of the lead frame rather than the semiconductor die. See, for example, co-pending U.S. application Ser. Nos. 08/906,673, 08/906,578, 08/709,182, 09/020,197, and 08/916,931, the disclosures of which are incorporated herein by reference. In one method, a liquid adhesive material is sprayed on the inverted attachment surfaces of the lead fingers. Some adhesive materials, however, may flow down the sides of the lead fingers and collect on the reverse surfaces of the lead fingers (e.g., the surfaces to which the bond wires will be attached). The adhesive material subsequently cures on these bond wire surfaces and can interfere with subsequent wire bonding, resulting in failure of the semiconductor component. The tendency for adhesives to flow from the lead finger attachment surfaces to the bond wire surfaces increases if the lead fingers are formed by a stamping process—which leaves a slight curvature, or rounding, of the edges of the lead fingers—rather than by an etching process. When this edge curvature is proximate the lead finger attachment surface, there is less resistance to the flow of the adhesive material and more adhesive material placed on the attachment surface consequently flows to the bond wire surface.

Finally, present methods of applying adhesive materials to a surface (whether of the semiconductor die or the lead finger) tend to waste the adhesive material. Spray application wastes adhesive material because not all of the sprayed adhesive material attaches to the target surface. Patterning the adhesive material on the semiconductor die results in substantial areas of the adhesive material of the pattern not being utilized. To obtain the combination of precise application with maximum material usage often makes the attachment process complex and difficult.

SUMMARY OF THE INVENTION

The present invention provides methods for attaching lead fingers to semiconductor dice and the structures formed thereby. In particular, the present invention provides methods, and the resulting structures, for attaching a semiconductor connection component (e.g., a lead frame) to bond pads of a semiconductor die by applying an adhesive material to a downset portion thereof. The downset portion of such a component is a first portion, which is horizontally offset from a second portion of the component. By applying the material only to the downset portion of the lead finger, which will then be attached to the die, the adhesive material is precisely applied in a simple process and, therefore, little adhesive material is wasted. The adhesive material and the downset portion provide a one-step electrical/mechanical connection to bond pads of the die, thereby eliminating wire or other separate electrical connections.

The methods of the present invention are practiced by providing a flowable adhesive material, providing a semiconductor connection component having a first portion horizontally offset from a second portion, and contacting the first portion of the semiconductor connection component with the adhesive material so a portion of the adhesive material attaches to the first portion. The semiconductor connection component may be a lead frame element having a lead finger. The adhesive material is an electrically-conductive material, such as an isotropic or anisotropically-conductive material. The semiconductor connection component with the adhesive material attached to the first portion may then be contacted with a surface of a semiconductor die to attach the semiconductor connection component to the die.

The methods of the present invention are also practiced by providing a flowable, electrically-conductive adhesive material and then contacting a portion of a bottom surface of the semiconductor connection component with the adhesive material so a portion of the adhesive material attaches to the bottom surface of the semiconductor connection component. The bottom surface of the semiconductor connection component may be first portion horizontally offset from a second portion of the component. The semiconductor connection component may be a lead frame element having a lead finger. The electrically-conductive adhesive material may be an isotropically or anisotropically-conductive material, such as a Z-axis anisotropically-conductive material. The semiconductor connection component with the adhesive material attached to the bottom surface thereof may then be contacted with a surface of a semiconductor die to attach the semiconductor connection component to the die.

BRIEF DESCRIPTION OF THE DRAWINGS

The following description of the invention refers to FIGS. 1–4, which are cross-sectional views of steps of one process according to the present invention, and the resulting structures. The figures presented in conjunction with this description are not actual views of any particular portion of an actual semiconductor device or component, but are merely representations employed to more clearly and fully depict the present invention.

DETAILED DESCRIPTION OF THE INVENTION

The following description provides specific details such as material thicknesses and types in order to provide a thorough understanding of the present invention. The skilled artisan, however, would understand that the present invention may be practiced without employing these specific details. Indeed, the present invention can be practiced in conjunction with fabrication techniques conventionally used in the industry.

The process steps and structures described below do not form a complete process flow for manufacturing IC devices or a completed device. Only the process steps and structures necessary to understand the present invention are described below.

Figure 1:
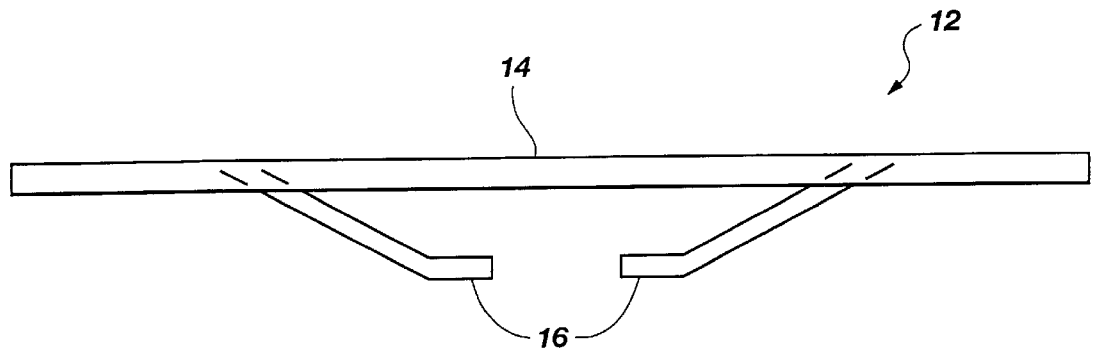

FIG. 1 illustrates a cross-sectional side-view of lead frame element 12. Lead frame element 12 comprises at least one lead finger 14 which will attach lead frame element 12 to a semiconductor die. Lead frame element 12 is formed of a long, thin strip of conductive material by any suitable process known in the art, such as stamping or etching from a sheet of such material along with, typically, a plurality of other lead frame elements extending from a supporting, peripheral frame. This conductive material can be any suitable material employed in the art, such as a metal, metal alloy, or the like. Preferably, the conductive material is copper, a copper alloy, or an iron/nickel alloy.

Figure 4:
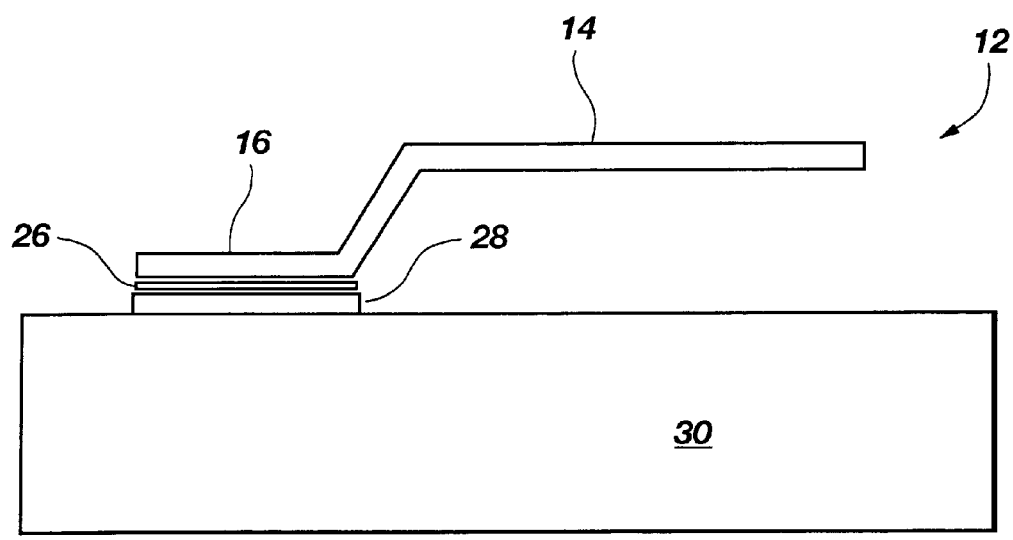

As depicted in FIG. 1, a portion of lead finger 14 is downset. The downset portion 16 is that portion of lead frame element 12 that will be attached to an active surface, such as bond pad 28, of semiconductor die 30, as shown in FIG. 4. With proper design of the lead frame, die bumping may not be necessary for a connection and, therefore, may optionally be excluded. Thus, the configuration (e.g., shape and size) of downset portion 16 will be dictated by its target location to the active surface. Lead finger 14 can be manufactured with downset portion 16 or can be manufactured as part of a substantially planar lead frame or lead frame strips and later bent to obtain downset portion 16. Preferably, lead finger 14 is manufactured with downset portion 16 defined therein. Any suitable process can be used to fabricate downset portion 16, such as deforming an etched lead frame element in a pressing or stamping operation, deforming a stamped lead frame element in a second stamping or pressing operation, or employing a singe-step stamping operation where one stamping die is formed as a female die with recesses at desired locations and the other stamping die is formed as a male die with extensions corresponding to the desired locations of the female die recesses.

Figure 2:
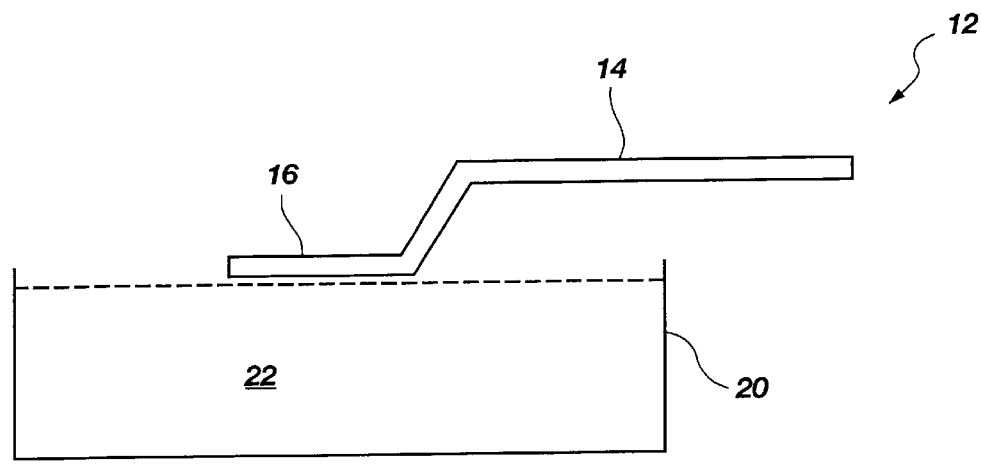

As shown in FIG. 2, downset portion 16 of lead finger 14 is contacted with adhesive material 22 in reservoir 20. Lead finger 14 is aligned over reservoir 20 and then lowered in a controlled manner by using a hydraulic, pneumatic, or electrically-powered mechanism to contact adhesive material 22. Lead finger 14 should be lowered only to the degree necessary to contact downset portion 16 with adhesive material 22. Rather than lowering the lead finger 14 to the reservoir, an elevator mechanism could be used to move the reservoir 20 upward to contact lead finger 14 with adhesive material 22. Typically, at least all of the lead frame elements of a lead frame, such as all of the lead fingers, to be adhered to a single die are coated at one time. Even more desirably, all of the downset portions of lead fingers of a plurality of lead frames of a lead frame strip may be coated simultaneously. Multiple reservoirs could be employed in the present invention so that adhesive material 22 can be simultaneously applied in such a manner.

It is not necessary to move reservoir 20 to bring adhesive material 22 into contact with lead finger 14. Instead, lead finger 14 may be brought close to the surface of adhesive material 22 in reservoir 20 and additional adhesive material 22 may be delivered to reservoir 20 to raise the adhesive level enough for adhesive material 22 to contact lead finger 14. Alternatively, it is possible to provide a moving wave or surge of adhesive material 22 traveling across the surface of adhesive material 22 in reservoir 20 to contact lead finger 14. Adhesive can also be spread out in a uniform layer using a doctor's blade, and then the lead frame dipped into the adhesive for application in another embodiment.

Adhesive material 22 may be any material capable of adhering to lead finger 14. Further, adhesive material 22 preferably has a viscosity high enough so it does not drip when lead finger 14 is removed from contact with reservoir 20. Any suitable adhesive material known in the art may be used, such as solders, thermoplastics, thermoset resins, flowable pastes and gels, B-stage epoxies, cyanate esters, bismaleimide, and polyimides, and the like.

Adhesive material 22 preferably comprises an electrically-conductive adhesive material. The electrically-conductive adhesive material may be isotropically or anisotropically conductive. An isotropically-conductive material is a material which conducts electricity in all directions, whereas an anisotropically-conductive material is one which conducts electricity in only one direction. An exemplary isotropically-conductive adhesive material is an adhesive material, such as those listed above, containing sufficient conductive material to obtain the desired conductivity. These materials can be in the form of a solid metal particle optionally coated with another metal (a poly-solder material) or a plastic particle coated with the desired metal. A preferred isotropically-conductive adhesive material is Hysol TG9001R-1. An exemplary anisotropically-conductive adhesive material is an adhesive material, such as those listed above, containing sufficient metal or metal-coated polymer particles to obtain the desired conductivity. A preferred anisotropically-conductive adhesive material is Dexter TG9001R-1, Zymet ZX04-1007AU, or a Z-axis anisotropically-conductive adhesive material. The Z-axis anisotropically-conductive adhesive material is a metal or metal-coated polymer composite capable of functioning as a compliant adhesive material. Exemplary Z-axis anisotropically-conductive adhesive materials include TG9001R-1. A preferred Z-axis anisotropically-conductive adhesive material is TG9001R-1.

Downset portion 16 of lead finger 14 is brought into contact with adhesive material 22 and then retracted. The forces of adhesion and surface tension inherent in adhesive material 22 cause the exposed surface of adhesive material 22 to form a slight meniscus, or convex-shaped configuration, above the edges of reservoir 20. Lead finger 14 is lowered onto or proximate this exposed surface of adhesive material 22. When downset portion 16 of the lead finger 14 contacts the exposed surface of adhesive material 22, adhesive material 22 wets out across downset portion 16.

Figure 3:
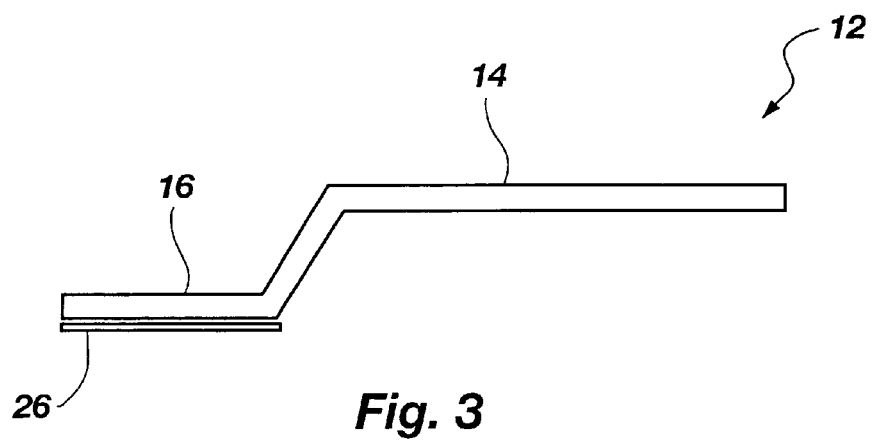

As illustrated in FIG. 3, when lead finger 14 is retracted from reservoir 20, the cohesion of adhesive material 22 pulls some of adhesive material 22 from reservoir 20 to form an adhesive film 26 on downset portion 16 of lead finger 14. The thickness of the adhesive film 26 depends primarily on the physical properties (e.g., viscosity) of adhesive material 22. The thickness of adhesive film 26 should be similar to the size of the conductive particles contained therein and/or should be sufficient to cover, but not overfill, bond pad 28 of semiconductor die 30. Preferably, the thickness of adhesive film 26 may range from about 3 to about 7 millimeters.

The pattern and shape of adhesive film 26 should be similar to the pattern of downset portion 16 and, therefore, similar to the pattern and shape of bond pad 28. Changing the size and/or shape of downset portion 16 or bond pad 28, changing the type of adhesive material 22, pre-coating the lead finger 24 with a surfactant, placing a solvent in adhesive material 22 to improve the wetting, and/or adding adhesion promotors (e.g., silane, siloxane, or polyimide siloxane) to adhesive material 22 will also change the thickness and/or pattern of adhesive film 26.

Preferably, the exposed surface of adhesive material 22 in reservoir 20 should be kept as level as possible. If the exposed surface is not level, downset portion 16 of lead finger 14 may extend too deeply into adhesive material 22. When this occurs, adhesive material 22 may wet the portions of lead finger 14 other than downset portion 16. The probability of adhesive material 22 wetting these other portions is diminished, however, by keeping the surface of adhesive material 22 level. Numerous techniques may be used to keep the exposed surface of adhesive material 22 level, including those disclosed in co-pending U.S. patent application Ser. No. 08/906,673.

Once adhesive material 22 has been applied to lead finger 14, lead frame element 12 may be fed to a curing oven, if necessary, to cure adhesive material 22. Bond pad 28 of semiconductor die 30 can then be attached to lead frame element 12 using adhesive film 26 by suitable LOC attach methods known in the art to obtain the structure illustrated in FIG. 4.

The present invention is not limited to the above description. The present invention is not limited to lead frame element 12 and can include TAB structures, other semiconductor connection components, and the like. The viscous material can also be applied under a partially-evacuated chamber so that lower viscosity materials could be used. The viscous material could also be applied to bus bars or other structures of a lead frame. The adhesive material is not limited to adhesives, but may include other viscous materials for a variety of applications, such as applying a polyimide film to a lead frame in order to eliminate the need for Kapton® tape. Reservoir 20 may be any structure which exposes a pool of viscous material and may be a variety of designs, such as those disclosed in co-pending U.S. patent application Ser. No. 08/906,673.

While the preferred embodiments of the present invention have been described above, the invention defined by the appended claims is not limited by the particular details set forth above and many apparent variations thereof are possible without departing from the spirit or scope thereof.

What is claimed is:

1. A method of applying an adhesive material to a semiconductor connection component, comprising:
   providing a pool of flowable adhesive material;
   providing at least one semiconductor connection component having a first portion horizontally offset from a second portion; and
   contacting the first portion of the at least one semiconductor connection component with the pool of flowable adhesive material so a portion of the flowable adhesive material attaches to the first portion.

2. The method of claim 1, wherein providing the at least one semiconductor connection component comprises providing a lead frame element.

3. The method of claim 2, wherein providing the pool of flowable adhesive material comprises providing a pool of an electrically-conductive flowable adhesive material.

4. The method of claim 3, wherein providing the pool of flowable adhesive material comprises providing a pool of an isotropically or anisotropically-conductive flowable adhesive material.

5. The method of claim 4, wherein providing the pool of flowable adhesive material comprises providing a pool of an anisotropically-conductive flowable adhesive material.

6. The method of claim 5, wherein providing the pool of flowable anisotropically-conductive flowable adhesive material comprises providing metal-coated polymer particles, metal particles, or metal-coated metal particles within the anisotropically conductive flowable adhesive material.

7. The method of claim 4, wherein providing the pool of flowable adhesive material comprises providing an isotropically-conductive flowable adhesive material.

8. The method of claim 7, wherein providing the pool of isotropically-conductive material comprises providing polysolder particles within the isotropically conductive flowable adhesive material.

9. The method of claim 1, further comprising vertically offsetting the first portion of the at least one semiconductor connection component from the second portion.

10. The method of claim 1, further comprising providing a reservoir for containing the pool of flowable adhesive material.

11. The method of claim 10, wherein providing the reservoir for containing the pool of flowable adhesive material comprises exposing a substantially level upper surface of the flowable adhesive material.

12. The method of claim 6, wherein contacting the first portion of the at least one semiconductor connection component with the flowable adhesive material so a portion of the flowable adhesive material attaches to the first portion comprises forming a film on the first portion of the at least one semiconductor component.

13. The method of claim 12, wherein forming the film of flowable adhesive material on the first portion of the at least one semiconductor component comprises forming the film to a thickness dimensionally similar to a size of the provided particles.

14. The method of claim 9, wherein contacting the first portion of the at least one semiconductor connection component with the flowable adhesive material so a portion of the flowable adhesive material attaches to the first portion comprises forming a film on the first portion of the at least one semiconductor component.

15. The method of claim 3, further comprising contacting the first portion with the attached flowable adhesive material to a surface of at least one semiconductor die.

16. The method of claim 3, further comprising contacting the first portion with the attached flowable adhesive material to a surface of at least one semiconductor die including at least one bond pad.

17. A method of applying an adhesive material to a semiconductor connection component, comprising:
 providing a at least one semiconductor connection component;
 providing at least one reservoir containing a flowable, electrically-conductive adhesive material; and
 contacting a portion of a bottom surface of the at least one semiconductor connection component with an exposed upper surface of the flowable, electrically-conductive adhesive material contained in the at least one reservoir so a portion of the flowable, electrically-conductive adhesive material attaches to the portion of the bottom surface of the at least one semiconductor connection component.

18. The method of claim 17, wherein providing the at least one semiconductor connection component comprises providing a lead frame element.

19. The method of claim 18, further comprising horizontally offsetting a first portion of the at least one semiconductor connection component from a second portion of the at least one semiconductor connection component.

20. The method of claim 19, further comprising vertically offsetting the first portion from the second portion of the at least one semiconductor connection component.

21. The method of claim 20, further comprising attaching the portion of the flowable, electrically-conductive adhesive material to only the first portion of the at least one semiconductor connection component.

22. The method of claim 21, wherein providing the flowable, electrically-conductive adhesive material comprises providing a flowable, isotropically-conductive or anisotropically-conductive adhesive material.

23. The method of claim 22, wherein providing the flowable, electrically-conductive adhesive material comprises providing a flowable, anisotropically-conductive adhesive material.

24. The method of claim 23, wherein providing the flowable, anisotropically-conductive adhesive material comprises providing metal-coated polymer particles, metal particles, or metal-coated metal particles within the flowable, anisotropically-conductive adhesive material.

25. The method of claim 22, wherein providing the flowable, electrically-conductive adhesive material comprises providing a flowable, isotropically-conductive adhesive material.

26. The method of claim 25, further comprising providing poly-solder particles within the flowable, isotropically-conductive adhesive material.

27. The method of claim 17, further comprising maintaining the exposed upper surface of the flowable, electrically conductive adhesive material contained in the at least one reservoir substantially level.

28. The method of claim 24, wherein contacting the first portion of the at least one semiconductor connection component with the flowable, anisotropically-conductive adhesive material so a portion of the flowable, anisotropically-conductive adhesive material attaches to the first portion comprises forming a film on the first portion of the at least one semiconductor component.

29. The method of claim 28, wherein forming the film of flowable, anisotropically-conductive adhesive material on the first portion of the at least one semiconductor connection component comprises forming the film to a thickness dimensionally similar to a size of the provided particles.

30. The method of claim 26, wherein contacting the first portion of the at least one semiconductor connection component with the flowable, anisotropically-conductive adhesive material so a portion of the flowable, anisotropically-conductive adhesive material attaches to the first portion comprises forming a film on the first portion of the at least one semiconductor connection component.

31. The method of claim 30, wherein forming the film of flowable, anisotropically-conductive adhesive material on the first portion of the at least one semiconductor connection component comprises forming the film to a thickness dimensionally similar to a size of the provided particles.

32. The method of claim 20, further comprising contacting the first portion with the attached flowable, electrically-conductive adhesive material to an active surface of at least one semiconductor connection component.

33. The method of claim 20, further comprising contacting the first portion with the attached flowable, electrically-conductive adhesive material to a surface of at least one semiconductor connection component including at least one bond pad.

34. A method of attaching a semiconductor connection component to a semiconductor die, comprising:
 providing at least one semiconductor die having an active surface;
 providing at least one semiconductor connection component including at least one horizontally and vertically downset portion thereof;
 contacting at least a portion of the horizontally and vertically downset portion of the at least one semiconductor connection component with at least one open pool of flowable adhesive material;
 separating the horizontally and vertically downset portion of the at least one semiconductor connection component from the at least one open pool of flowable adhesive material;
 contacting the horizontally and vertically downset portion of the at least one semiconductor connection component with the active surface of the at least one die to attach the at least one semiconductor connection component to the at least one semiconductor die.

35. The method of claim 1, wherein providing the at least one semiconductor connection component comprises stamp-forming at least the first portion of the at least one semiconductor connection component.

36. The method of claim 9, wherein vertically offsetting the first portion of the at least one semiconductor connection component comprises at least one pressing operation to deform the at least one semiconductor connection component so as to vertically position the first portion of the at least one semiconductor connection component.

37. The method of claim 9, wherein providing the at least one semiconductor connection component comprises stamp-forming at least the first portion of the at least one semiconductor connection component and vertically offsetting the first portion of the at least one semiconductor connection component by a subsequent pressing operation to vertically position the first portion of the at least one semiconductor connection component.

38. The method of claim 37, wherein providing the at least one semiconductor connection component comprises stamp-forming at least the first portion of the at least one semiconductor connection component and the subsequent pressing operation to vertically position the first portion of the at least one semiconductor connection component in a single, combined operation.

39. The method of claim 17, wherein providing at least one semiconductor connection component comprises stamp-forming at least the first portion of the at least one semiconductor connection component.

40. The method of claim 20, wherein vertically offsetting the first portion of the at least one semiconductor connection component comprises at least one pressing operation to deform the at least one semiconductor connection component so as to vertically position the first portion of the at least one semiconductor connection component.

41. The method of claim 20, wherein providing at least one semiconductor connection component comprises stamp-forming at least the first portion of the at least one semiconductor connection component and vertically offsetting the first portion of the at least one semiconductor connection component by a subsequent pressing operation to vertically position the first portion of the at least one semiconductor connection component.

42. The method of claim 41, wherein providing the at least one semiconductor connection component comprises stamp-forming at least the first portion of at least one the semiconductor connection component and the subsequent pressing operation to vertically position the first portion of the at least one semiconductor connection component in a single, combined operation.

* * * * *

UNITED STATES PATENT AND TRADEMARK OFFICE
CERTIFICATE OF CORRECTION

PATENT NO.    : 6,110,761
DATED         : August 29, 2000
INVENTOR(S)   : Syed Sajid Ahmad It is certified that error appears in the above-identified patent and that said Letters Patent is hereby corrected as shown below:

Column 5,
Line 34, after "finger" change "24" to -- 14 --

Column 6,
Line 3, change "Kapton ®" to -- Kapton™ --

Column 8,
Line 49, after "one" and before "die" insert -- semiconductor --

Column 10,
Line 13, after "of" and before "at" insert -- the -- and after "one" delete "the"

Signed and Sealed this

Third Day of February, 2004

JON W. DUDAS
*Acting Director of the United States Patent and Trademark Office*